United States Patent
Ko et al.

(10) Patent No.: US 7,465,620 B2
(45) Date of Patent: Dec. 16, 2008

(54) TRANSISTOR MOBILITY IMPROVEMENT BY ADJUSTING STRESS IN SHALLOW TRENCH ISOLATION

(75) Inventors: Chih-Hsin Ko, Fongshan (TW); Chung-Hu Ke, Taipei (TW); Chien-Chao Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/702,399

(22) Filed: Feb. 5, 2007

(65) Prior Publication Data

US 2007/0132035 A1   Jun. 14, 2007

Related U.S. Application Data

(62) Division of application No. 11/004,690, filed on Dec. 3, 2004, now Pat. No. 7,190,036.

(51) Int. Cl.
*H01L 21/8238* (2006.01)
*H01L 21/336* (2006.01)
*H01L 21/44* (2006.01)

(52) U.S. Cl. .................. 438/199; 438/296; 438/299; 438/655

(58) Field of Classification Search ........... 438/439, 438/199, 299, 655, 303, 305, 682, 424, 294
See application file for complete search history.

(56) References Cited

U.S. PATENT DOCUMENTS

| | | | | |
|---|---|---|---|---|
| 5,780,348 A | * | 7/1998 | Lin et al. ............ | 438/303 |
| 5,792,684 A | * | 8/1998 | Lee et al. ............ | 438/238 |
| 5,904,531 A | * | 5/1999 | Liaw ................... | 438/296 |
| 6,133,105 A | | 10/2000 | Chen et al. | |
| 6,339,018 B1 | | 1/2002 | Ballantine et al. | |
| 6,395,598 B1 | * | 5/2002 | Hirai et al. ........... | 438/242 |
| 6,429,061 B1 | | 8/2002 | Rim | |
| 6,882,025 B2 | * | 4/2005 | Yeo et al. ............. | 257/510 |

OTHER PUBLICATIONS

Ge, C.-H., et al., "Process-Strained Si (PSS) CMOS Technology Featuring 3D Strain Engineering," IEEE, Mar. 2003, 4 pages.
Shimizu, A., et al., "Local Mechanical-Stress Control (LMC): A New Technique for CMOS-Performance Enhancement," IEEE, 2001, 4 pages.
Lee, J.-H., et al., "A Study of Stress-Induced p+/n Salicided Junction Leakage Failure and Optimized Process Conditions for Sub-0.15-μm CMOS Technology," IEEE Transactions on Electron Devices, vol. 49, No. 11, Nov. 2002, pp. 1985-1992.

* cited by examiner

*Primary Examiner*—Chuong A. Luu
(74) *Attorney, Agent, or Firm*—Slater & Matsil, L.L.P.

(57) ABSTRACT

A method of improving the carrier mobility of a transistor is presented. A trench is formed in a substrate. The trench is filled with a dielectric. A CMOS transistor is formed adjacent to the trench. A silicide layer is formed on the source/drain region. After the step of forming the silicide layer, a recess is formed by etching the dielectric so that the surface of the dielectric is substantially lower than the surface of the substrate. Recessing the STI causes the removal of the compressive stress applied to the channel region by the STI material. A contact etch stop layer (CESL) is formed over the gate electrode, spacers, source/drain region and the dielectric. The CESL applies a desired stress to the channel region. Trench liners may optionally be formed to provide a stress to the channel region. A trench spacer may optionally be formed in the STI recess.

17 Claims, 8 Drawing Sheets

TRANSISTOR MOBILITY IMPROVEMENT BY ADJUSTING STRESS IN SHALLOW TRENCH ISOLATION

This application is a divisional of patent application Ser. No. 11/004,690 (TSM04-0454), entitled "Transistor Mobility Improvement by Adjusting Stress in Shallow Trench Isolation," filed Dec. 3, 2004, which application is incorporated herein by reference. This application is a divisional of 11/004, 690 filed on Dec. 03, 2004, now U.S. Pat. No. 7,190,036.

TECHNICAL FIELD

This invention relates generally to semiconductor integrated circuits, and more specifically to the improvement of CMOS transistors by applying stress.

BACKGROUND

The scaling of VLSI circuits is a constant effort. With circuits becoming smaller and faster, device driving current improvement becomes more important. Device current is closely related to gate length, gate capacitance, and carrier mobility. Shortening poly-gate length, increasing gate capacitance and increasing carrier mobility can improve the device current performance. Gate length reduction is an on-going effort in order to shrink circuit size. Increasing gate capacitance has also been achieved by efforts such as reducing the gate dielectric thickness, increasing the gate dielectric constant, and the like. In order to further improve device current, enhancing carrier mobility has also been explored.

Among efforts made to enhance carrier mobility, forming a stressed silicon channel is a known practice. Stress can enhance bulk electron and hole mobility. The performance of a CMOS transistor can be enhanced through a stressed-surface channel. This technique allows performance to be improved at a constant gate length, without adding complexity to circuit fabrication or design.

When silicon is placed under stress, the electron mobility is dramatically increased. Stress can also be applied to the channel region by forming a stress-inducing contact etch stop layer (CESL) over the transistor. When such a contact etch stop layer is deposited, due to the lattice spacing mismatch between the CESL and the underlying layer, a stress develops to match the lattice spacing.

The stress may have components parallel to the transistor channel and parallel to the transistor width direction. Research has revealed that a CESL that induces a tensile stress field in channel length direction can improve NMOS performance, and compressive stress can improve pMOS performance. In order to increase the beneficial effects and reduce the detrimental effects, it is desired that the tensile stress in the channel length direction be increased for nMOS transistors, and the compressive stress in the channel length direction be increased for pMOS transistors.

FIG. 1 illustrates a conventional NMOS transistor 1. Shallow trench isolations (STI) 4 are formed in the neighborhood of CMOS transistor 1. STIs 4 typically generate a compressive stress to the channel region of the transistor 1. This reduces the carrier mobility and hence degrades the device performance for NMOS transistors. Attempts are made to reduce the detrimental effect of the STIs 4. FIG. 2 illustrates one such attempt. The gate structure comprises a dielectric 10, a gate electrode 12 and gate spacers 14. STIs 4 are recessed below the surface of the substrate 2. The removal of the STI material at opposite ends of the device channel 16 eliminates the compressive force caused by the STI material. Silicides 8 are then formed. Since recessing the STIs 4 exposes the silicon substrate 2 at the sidewall 11 of the substrate 2, a silicide penetration 13 is formed on the sidewalls 11 of the STI recesses. The penetrations 13 cause a leakage current and therefore degrade the device performance. Typically, for CMOS transistors with wide junctions (the distance L between STIs 4 is great), there is less of a silicide penetration problem. When the devices are scaled down and the junctions are small, however, the penetration problem is more severe. Therefore, a method is needed for controlling the stress applied by STI without incurring a silicide penetration.

SUMMARY OF THE INVENTION

The preferred embodiments of the present invention present a method of improving transistor carrier mobility by adjusting stress through recessing shallow trench isolations.

In accordance with one aspect of the present invention, a trench is formed in a substrate. The trench is filled with a dielectric material. A CMOS transistor is formed next to the trench. A silicide layer is formed on the surface of the source/drain region. A recess is formed by removing a portion of the dielectric material, so that the surface of the dielectric material is substantially lower than the surface of the substrate. The recess may be formed by any removal process, preferably by a selective etch process or etch-back process. The recessing of the STI removes the compressive stress applied to the channel region by STI material. A contact etch stop layer (CESL) is formed over the gate electrode, gate spacers, source/drain and the dielectric material. The CESL also applies a stress to the channel region of the transistor. Since the removal of portions of the STI is performed after the formation of the silicide, there is no silicide penetration.

In accordance with another aspect of the present invention, the STI is etched back first, and silicides on the source and drain regions are then formed. Trench spacers are formed protecting the substrate material before forming silicides so that there is no silicide formed on the sidewall of the substrate in the recess. Also, a CESL is applied to apply a beneficial stress to the channel of the CMOS device.

In accordance with yet another aspect of the present invention, the STI has a composite structure. That is, it has one, and optionally two, dielectric liners under the dielectric material. The extra liners not only provide a stress to the channel of the CMOS device, but they also protect the sidewalls of the substrate in the recess of the STI from forming a silicide penetration.

By recessing the STI, the stress originally applied by the STI material is reduced or eliminated. The CESL formed in the recess may then apply a desired stress to the channel based on the type of CMOS transistor. The carrier mobility of the CMOS transistor is improved, thus performance is enhanced. The silicide penetration problem is also solved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments are illustrated in FIGS. 3 through 16 wherein like reference numbers are used to designate like elements throughout the various views and illustrative embodiments of the present invention.

Figure 1:
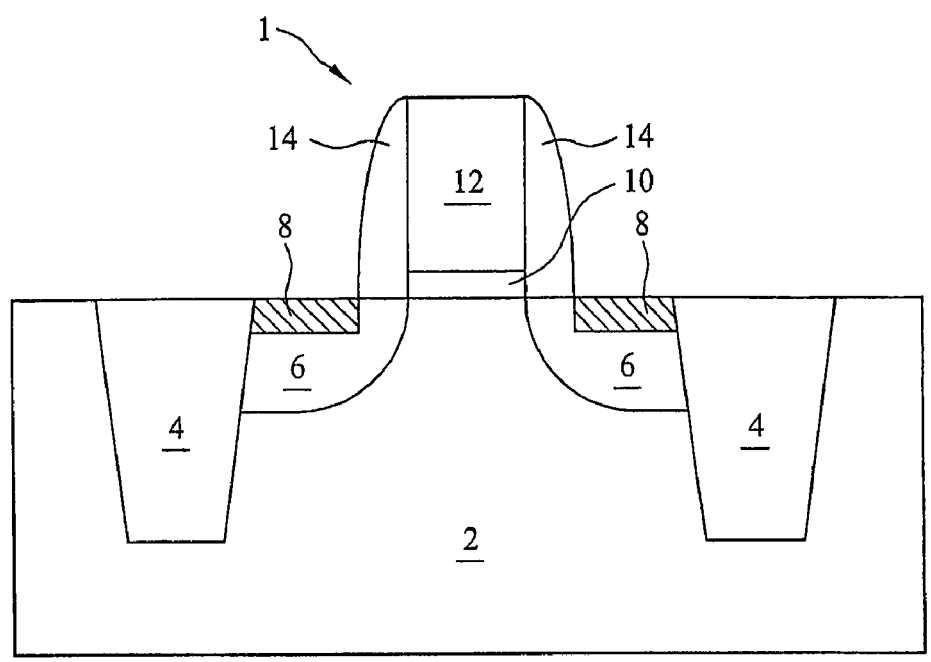
FIG. 1 illustrates a conventional nMOS transistor.
Figure 2:
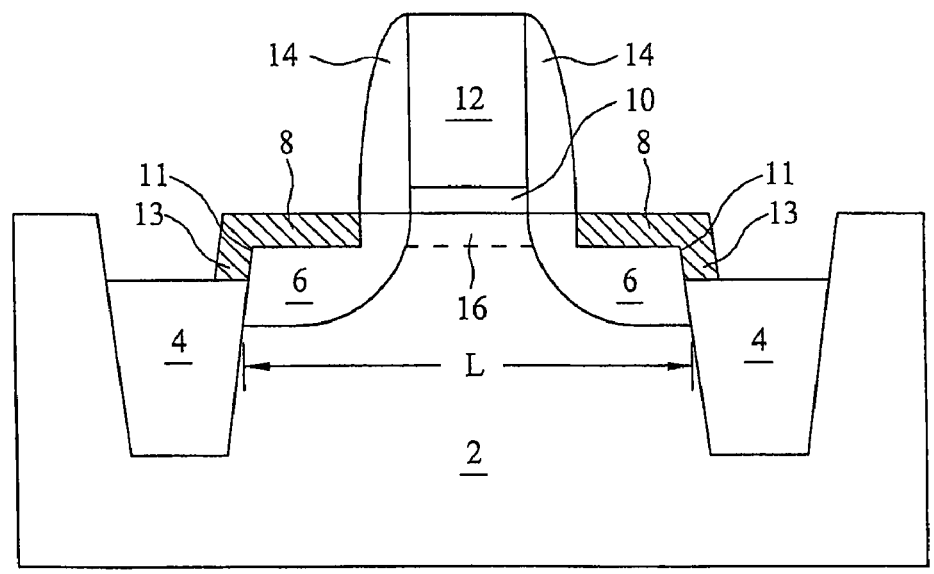
FIG. 2 illustrates a conventional NMOS transistor having a silicide penetration.
Figure 3:
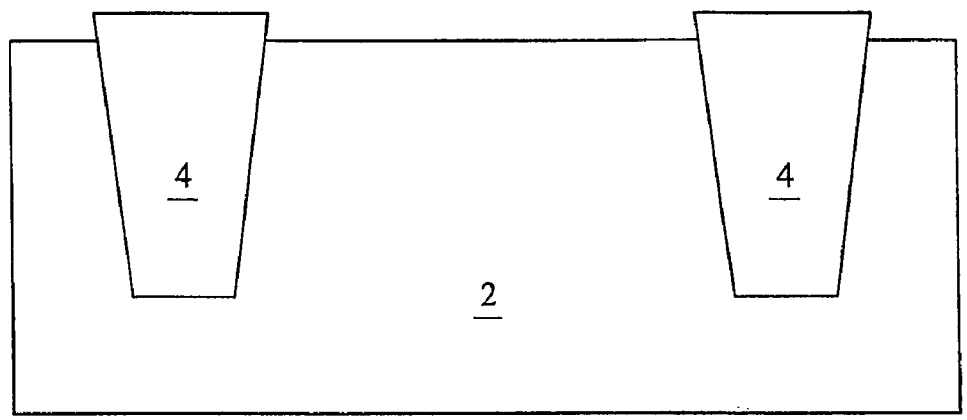
FIGS. 3 through 7 illustrate a first preferred embodiment of the present invention.

FIGS. 3 through 7 illustrate a preferred embodiment of the present invention. FIG. 3 illustrates the formation of shallow trench isolations (STI) 4 in a substrate 2. In the preferred embodiment, substrate 2 is a silicon substrate. In other embodiments, substrate 2 comprises materials such as germanium, carbon, and/or their combinations. STIs 4 are formed in the substrate 2, preferably by etching shallow trenches in substrate 2, then filling the trenches through high density plasma deposition of $SiO_2$, or HDP oxide. The trenches can also be filled by a dielectric material comprising polysilicon. The process is controlled so that the STI is raised above the substrate 2, preferably about 0 Å to about 500 Å. By making STIs 4 with an acceptable height, the silicide formed in the subsequent steps is less likely to have penetration formed along the edge of the STIs 4. To improve the performance of the transistor to be formed, the STIs 4 are preferably located such that if a line is drawn between the STIs 4, the line is along the 110 or 100 direction of the substrate lattice structure. Therefore, the orientation of the transistor channel is along the 110 or 100 direction.

Figure 4:
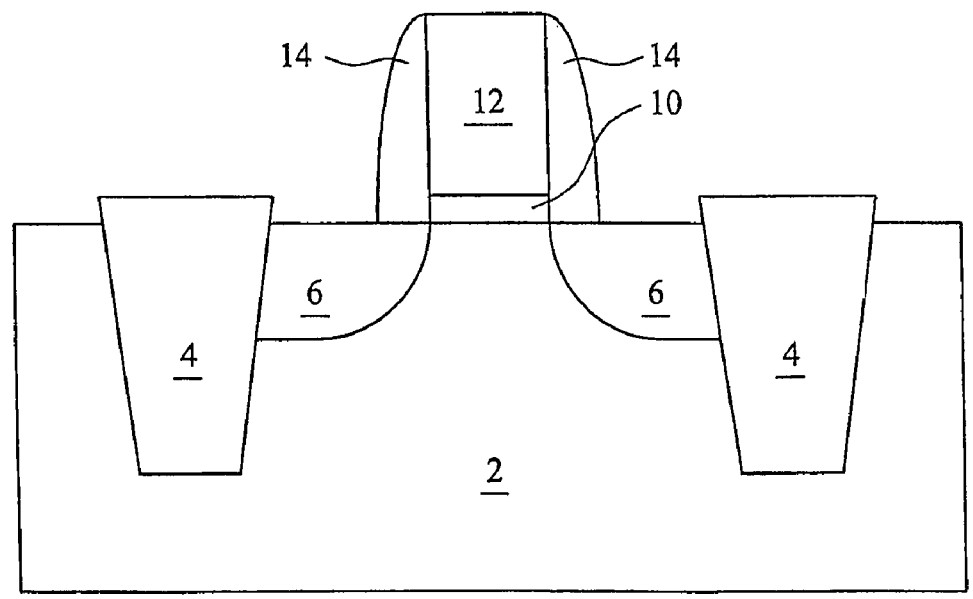

FIG. 4 illustrates the formation of a gate stack, spacers, and source and drain regions. A gate dielectric 10 is deposited on the surface of substrate 2. A gate electrode 12 is formed on gate dielectric 10. The gate electrode 12 is preferably polysilicon, although it may be formed of metal, or a compound structure comprising metal, semiconductor, metal oxide and/or silicide.

A pair of spacers 14 is formed along the sidewalls of the gate dielectric 10 and gate electrode 12. Spacers 14 serve as self-aligning masks for a subsequent source/drain formation process. The spacer material can be oxide, silicon nitride, oxy-nitride or any combinations thereof. The spacers 14 may be formed by well-known methods such as blanket depositing a dielectric layer over substrate 2 and gate electrode 12 using thermal process, low pressure chemical vapor deposition (LPCVD) or plasma enhanced vapor deposition (PECVD), then anisotropically etching the dielectric material to remove the dielectric material from horizontal surfaces but not from the gate electrode sidewalls. In a more preferred embodiment, the spacers 14 comprise a silicon nitride layer formed on an $SiO_2$ layer. With such a structure, the spacers 14 not only have a high-k of silicon nitride (about 7.5), but they also have the excellent quality of $SiO_2$. Using silicon nitride in the spacers 14 also makes a selective etching possible when the STIs 4 are etched back.

Source and drain regions 6 are then formed. Source and drain regions 6 can be formed by implanting the desired dopant into silicon substrate 2 or by recessing the source and drain regions followed by epitaxially growing silicon with desired dopant. The formation of source and drain regions 6 are well known in the art. The details are not repeated herein.

Figure 5:
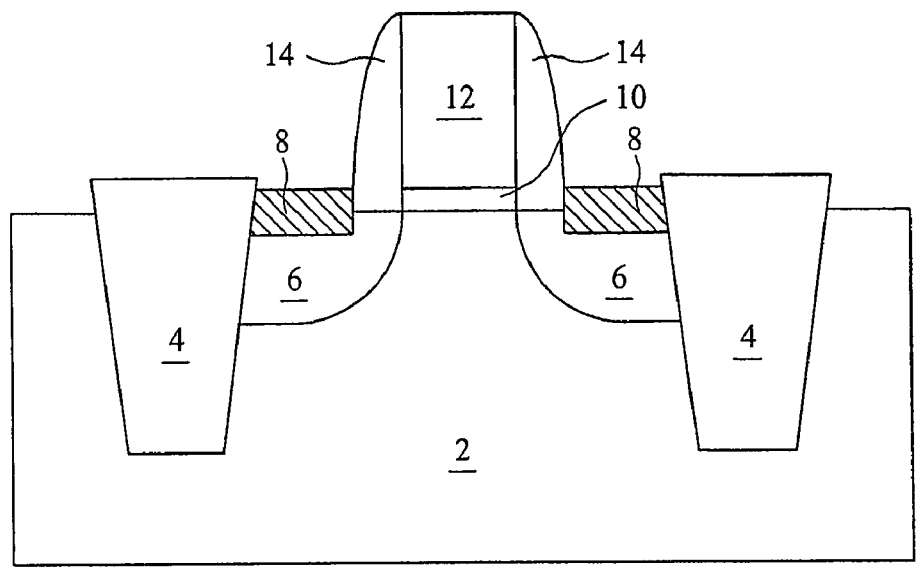

As illustrated in FIG. 5, a metal silicide 8, or a conductive layer, is formed on source and drain regions 6. In the preferred embodiment, silicide layer 8 is formed by first depositing a thin composite layer of metal, then annealing to form a silicide 8 between the deposited metal and the underlying exposed silicon regions. The metal forming the silicide may be a transition metal or metal compound such as titanium, cobalt, tungsten, tantalum, nickel, or the like or some other appropriate conductive material. The metal can be deposited by chemical vapor deposition (CVD), physical vapor deposition (PVD) or other alternatives. The upper portion of any un-reacted metal is then removed.

Figure 6:
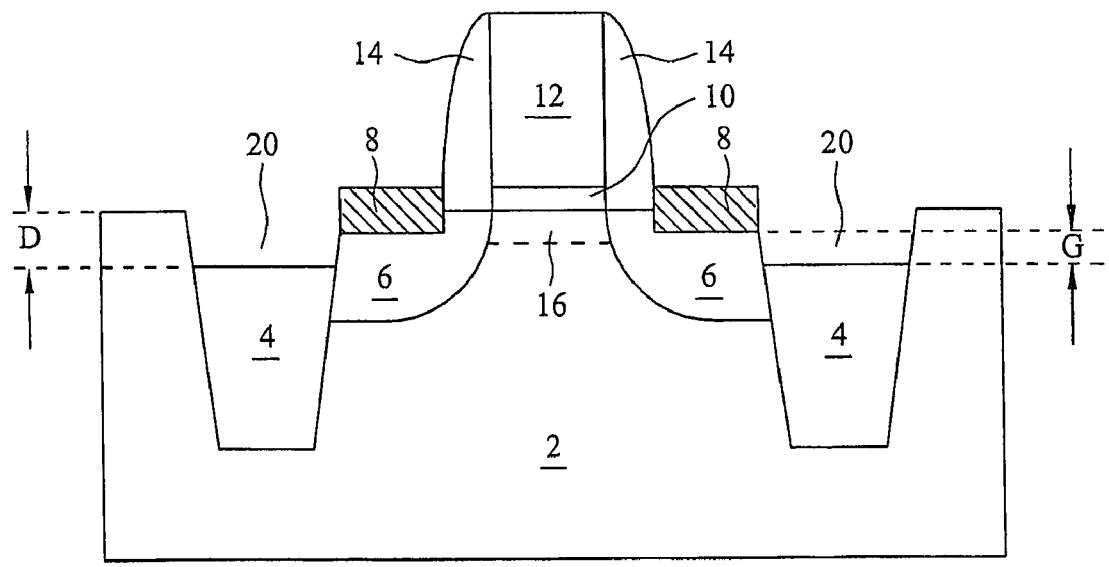

The STIs 4 are then etched back, as shown in FIG. 6. A highly selective etching back process is performed so that the spacers 14 are substantially not affected. In the preferred embodiment, a dry etch is performed. As discussed, the spacers 14 preferably comprise a silicon nitride on top, therefore an etchant, or gases that only attack HDP oxide but not silicon nitride, can be used. The etching back distance D is desired to be great enough so that the top portion on opposite sides of the device channel 16 is substantially removed and there is no STI material applying compressive stress to the channel 16. Therefore, it is desired that the top surfaces of the recessed STIs 4 be substantially lower than channel 16 of the CMOS transistor. The top surface of the recessed STIs 4 is lower than the top surface of the substrate 2. Preferably, the recessing depth D is between about 50 Å to about 1000 Å. It is noted that since the STIs 4 are recessed after the formation of silicide 8, no silicide penetration is formed. A gap G as shown in FIG. 6 between the top surfaces of the recessed STIs 4 and the silicide 8 is about 50 Å to about 900 Å. The gap G defines a portion on the sidewalls of the STIs 4 where silicide penetration may occur.

Figure 7:
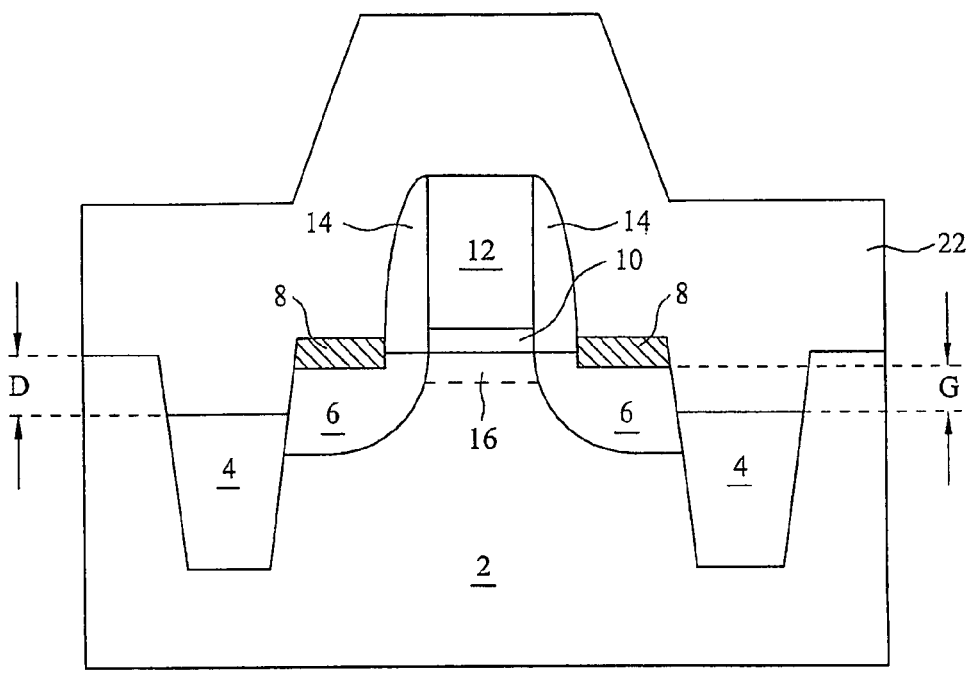

FIG. 7 illustrates formation of a contact etch stop layer (CESL) 22. This layer serves two purposes: first, it provides stress to the device and enhances carrier mobility; and second, it acts as an etch stop layer to protect underlying regions from being over etched. Since a tensile stress on channel 16 is beneficial to NMOS transistors and a compressive stress is beneficial to pMOS transistors, a CESL 22 with tensile stress is preferred for an nMOS transistor, and a CESL 22 with compressive stress is preferred for a pMOS transistor. It is desired that the magnitude of the stress applied by the CESL is higher than about 100 MPa, and more preferably higher than about 500 MPa. In the case where the formed transistor is a pMOS transistor, since the original STI provides a compressive stress if there is no recess formed, the CESL layer 22 is preferred to have a compressive stress higher than the original stress provided by the STI, preferably higher than about 500 MPa. As known in the art, contact etch stop layer 22 needs to have a certain thickness to provide enough stress. Therefore a thickness of about 10 nm to about 100 nm, and more preferably about 50 nm, for CESL 22 is desired. In the preferred embodiment, CESL 22 is silicon nitride. In other embodiments, silicon dioxide, SION, and their combinations can also be used.

Figure 8:
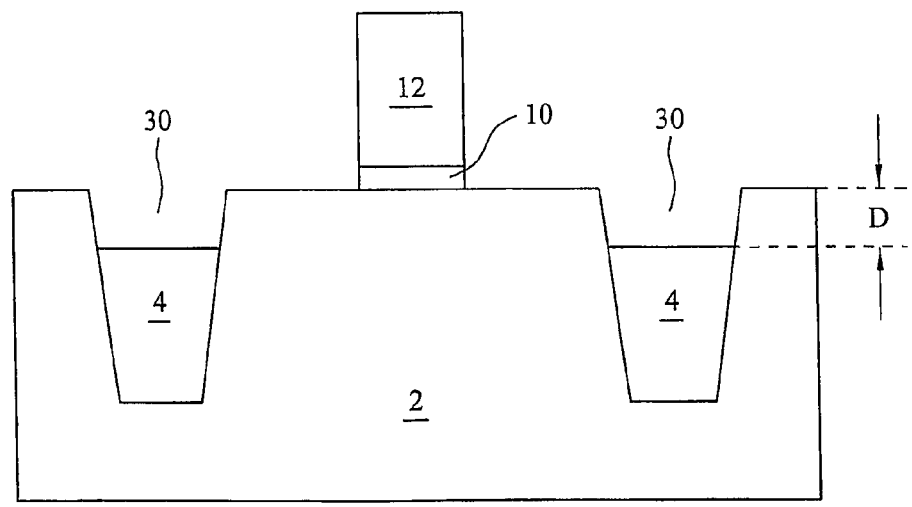
FIGS. 8 through 12 illustrate a second preferred embodiment of the present invention.

FIGS. 8 through 12 illustrate a second preferred embodiment. FIG. 8 illustrates the formation of a gate dielectric 10 and a gate electrode 12 between STIs 4. STIs 4 are etched back, preferably by dry etching, therefore forming recesses 30. The preferred depth D of the recessing 30 is about 50 Å to about 1000 Å, and more preferably about 700 Å.

Figure 9:
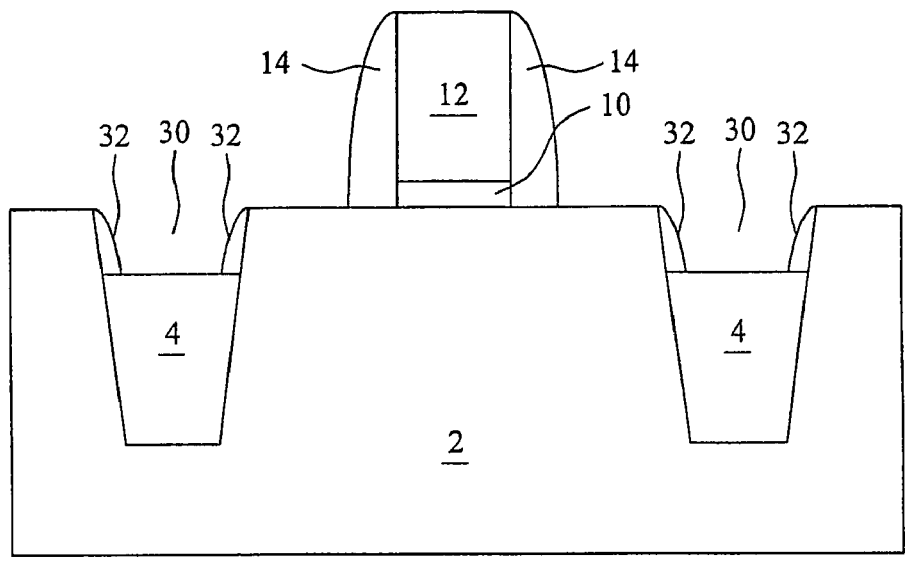

FIG. 9 illustrates the formation of gate spacers 14 and trench spacers 32. Gate spacers 14 are formed on the sidewalls of the gate dielectric 10 and gate electrode 12. Trench spacers 32 are formed on the sidewalls of the recess 30 in the silicon substrate 2. Preferably, gate spacers 14 and trench spacers 32 are formed at the same time and by the same process. Trench spacers 32 protect the substrate 2 so that it is not exposed from the side.

Figure 10:
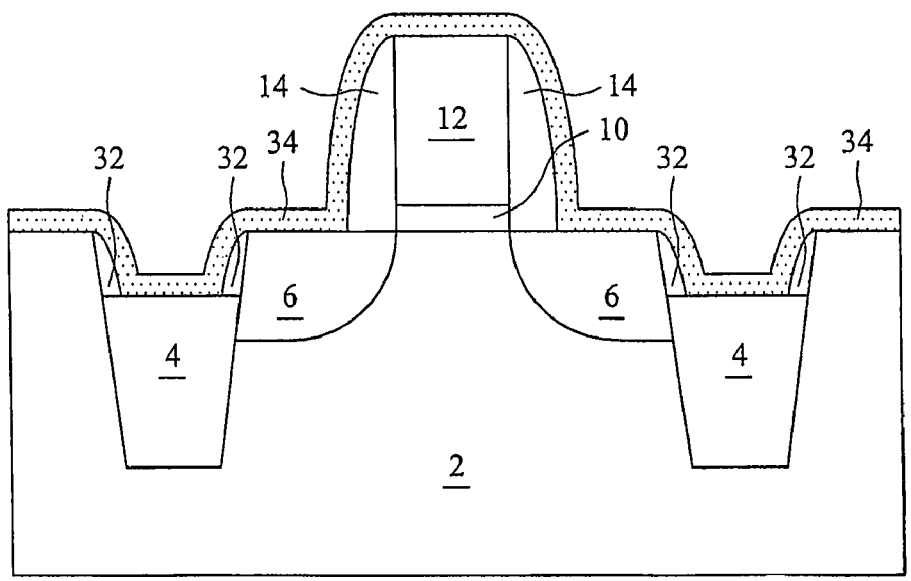

FIG. 10 illustrates the formation of source and drain regions 6, followed by the deposition of a metal layer 34. In the preferred embodiment, the metal layer 34 is blanket deposited on regions including electrode 12, spacers 14 and 32, source/drain regions 6 and STIs 4. In other embodiments, the metal layer 34 can also be deposited on source/drain regions 6 only.

Figure 11:
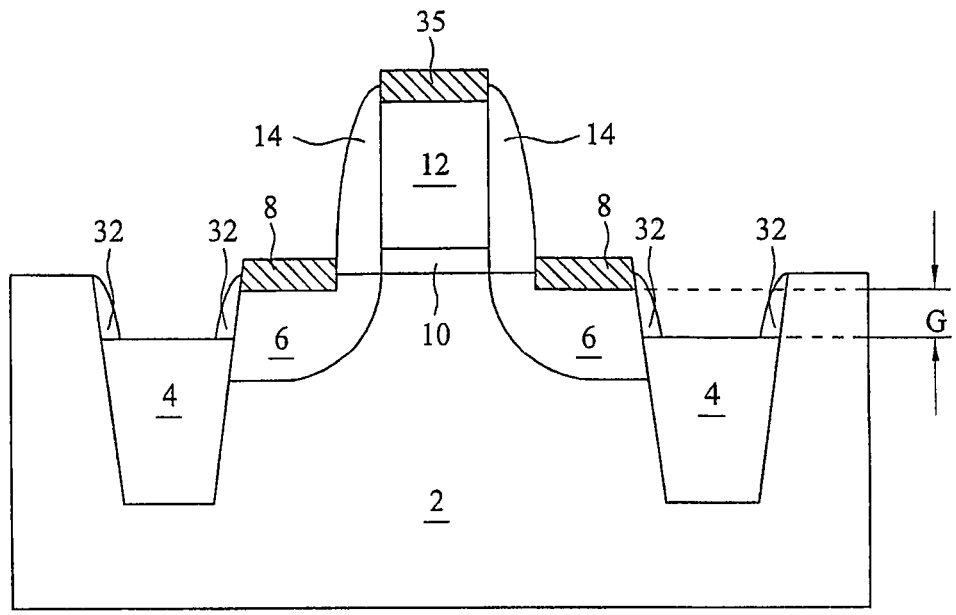

FIG. 11 illustrates the formation of silicide 8. After annealing, a silicide 8 is formed between the source/drain regions 6 and metal 34. At the same time, a silicide 35 is formed between the gate electrode 12 and metal layer 34. It is appreciated that the metal 34 formed on trench spacers 32 and gate spacers 14 does not form a silicide layer since there is no underlying silicon/polysilicon. Un-reacted metal is then removed leaving silicides 8 and 35. The trench spacers 32 and gate spacers 14 are exposed.

Figure 12:
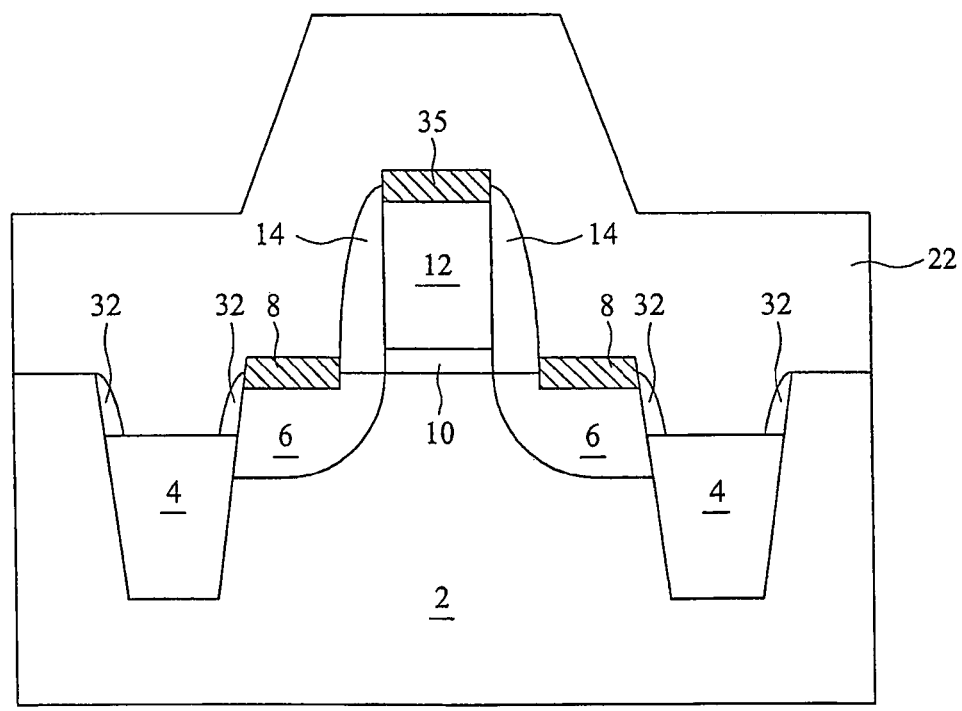

FIG. 12 illustrates a CESL 22 formed on the silicide 35, gate spacers 14, trench spacer 32, suicides 8 and STIs 4. Similar to the previous embodiment, CESL 22 provides either a tensile stress or a compressive stress to improve carrier mobility.

It is to be appreciated that in the second preferred embodiment, the silicide 8 is formed after the STIs 4 are recessed. Although the sidewall of the substrate 2 is exposed due to recessing, by forming trench spacers 32, silicide penetration is prevented. Since the trench spacers 32 are formed at the same time the gate spacers 14 are formed, no extra mask is required.

Figure 13:
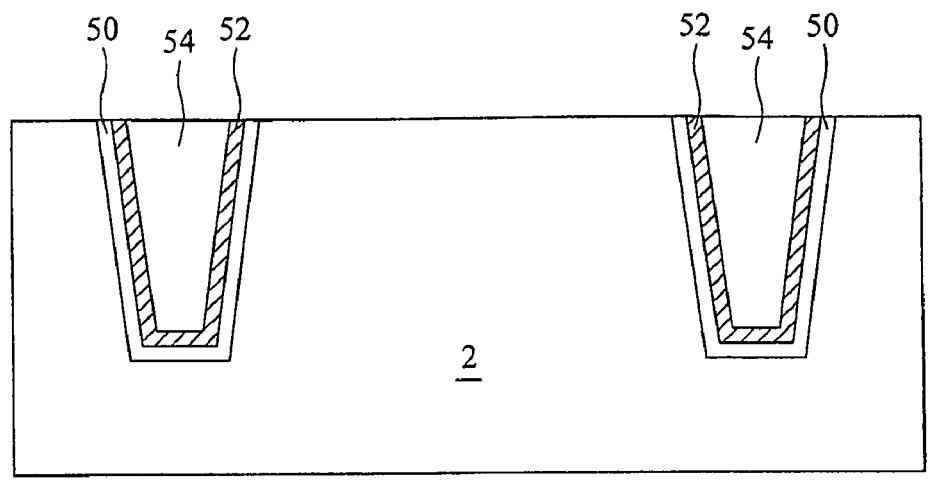
FIGS. 13 through 16 illustrate a third preferred embodiment of the present invention.

Yet another preferred embodiment is illustrated in FIGS. 13 through 16. FIG. 13 illustrates the formation of shallow trench isolations. Trenches are formed, preferably by etching the substrate 2. A first trench liner, also called trench liner oxide 50 is formed in a trench. Trench liner oxide 50 is typically a thermal oxide having a preferred thickness of between about 20 Å to about 500 Å. The liner oxide 50 helps fix the defects of the trench such as damage caused to the exposed surfaces of the trench arising from the etch step. It also rounds the trench comers so that the electrical field is less concentrated at the comers.

A second trench liner 52 is formed on the first trench liner oxide 50. It has a preferred thickness of between about 20 Å to about 200 Å. The second trench liner 52 has an inherent stress so that it applies a stress to the channel region of the CMOS transistor that will be formed in subsequent steps. The stress type depends on the type of CMOS transistor. If the transistor is an NMOS transistor, the second trench liner 52 preferably has a tensile stress. Conversely, if the neighboring transistor is a pMOS transistor, the second trench liner 52 preferably has a compressive stress. In either case, the stress is preferably higher than about 100 MPa. The second trench liner 52 is a dielectric layer preferably formed of $Si_3N_4$, $SiO_2$, SiON, and combinations. It can be formed by CVD, PCVD or other known methods.

Figure 14:
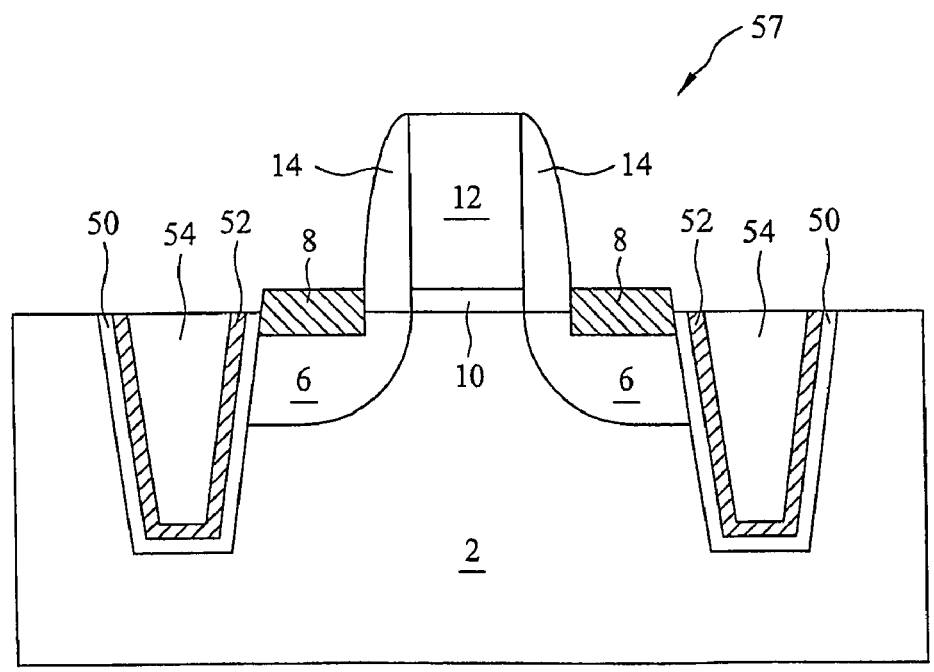

A third dielectric material 54 is then formed filling the remaining space of the trench. Preferably, the third dielectric 54 is a HDP CVD oxide. A CMOS transistor 57 comprising gate dielectric 10, gate electrode 12, gate spacers 14, source/drain regions 6 and suicides 8 is then formed. The resulting structure is shown in FIG. 14.

Figure 15:
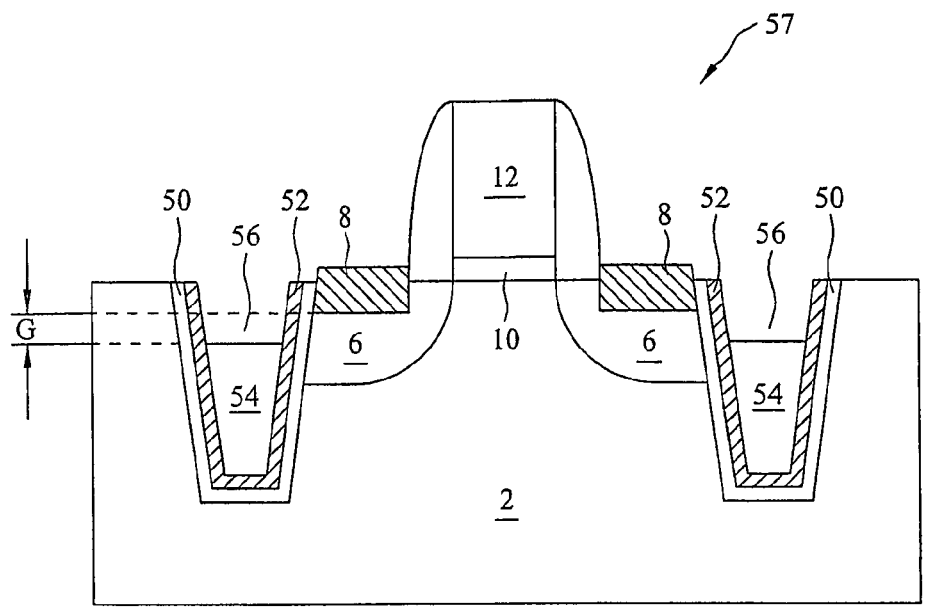

FIG. 15 shows that the third dielectric 54 is selectively etched to form a recess 56. The material of the second trench liner 52 is preferably different from the material of the third dielectric 54. Therefore, when recessing the third dielectric 54, the second trench liner 52 is not attacked. In other embodiments, the first trench oxide 50 can be omitted and the second trench liner 52 can be formed directly in the trench.

Figure 16:
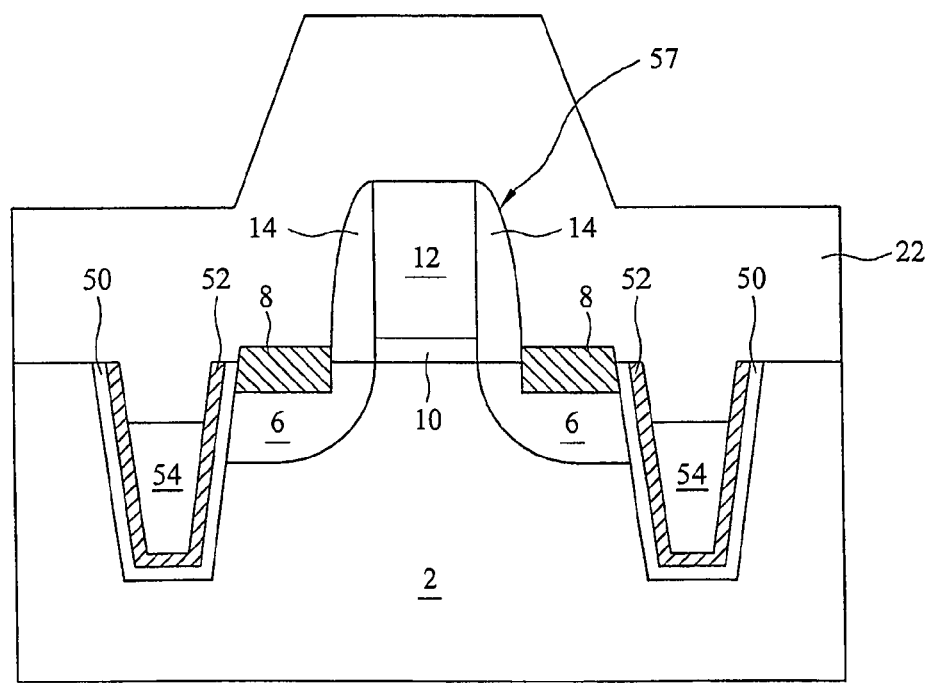

FIG. 16 illustrates a CESL 22 formed on the CMOS transistor 57, the first trench liner 50, the second trench liner 52 and the third dielectric 54. The second trench liner 52 and the CESL 22 provide a combined tensile or compressive stress to the channel of the CMOS transistor 57 based on the CMOS transistor type so that the stress applied to the channel region can be adjusted in a greater range.

In the preferred embodiments discussed above, removal of the STI material at opposite ends of the device channel eliminates the compressive force caused by the STI materials. The applied CESL 22 further changes the stress applied to the device channel region. In order to effectively modify the stress applied by the STI material, the respective top surface of the recessed dielectrics 4 and 54 in FIGS. 6, 11 and 15 are preferably lower than the bottom of the silicide 8 by a gap G of preferably between about 50 Å to about 900 Å, and more preferably about 500 Å. This gap G ensures that the top surfaces of the recessed dielectric are lower than the channel region so that the benefit of the preferred embodiments of the present invention is maximized.

The test data has shown that the stress has been significantly modified by using preferred embodiments of the present invention. An exemplary data reveals that for a conventional nMOS transistor, a 520 MPa compressive stress is simulated in the channel region. When the first preferred embodiment of the present invention is employed, the detrimental compressive stress is reduced to about 216 MPa.

The preferred embodiments of the present invention improve the carrier mobility and thus improve CMOS transistor performance. The silicide penetration problem is also solved by using various schemes as described.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit structure, the method comprising:

providing a substrate;

forming a MOS device at a surface of the substrate, the MOS device having a source/drain region with at least a portion in the substrate;

forming a trench in the substrate and adjacent to the MOS device, wherein the portion of the source/drain region is exposed through a sidewall of the trench;

filling a dielectric in the trench to a height substantially level with or higher than a top surface of the substrate;

forming a conductive layer directly on the source/drain region, wherein the trench is free from the conductive layer, and wherein the conductive layer is formed of a silicide; and recessing at least a portion of the dielectric to form a recess after the step of forming the conductive layer.

2. The method of claim 1 further comprising forming a trench liner before the step of filling the dielectric, wherein the trench liner is not recessed.

3. The method of claim 1, wherein a top surface of the dielectric is recessed from the surface of the substrate by about 50 Å to about 1000 Å.

4. A method of forming an isolation structure for a transistor, the method comprising:

providing a substrate having a trench;

filling the trench with a dielectric;

forming a gate dielectric on the substrate;

forming a gate electrode on the gate dielectric;

forming a pair of gate spacers on sidewalls of the gate dielectric and the gate electrode;

forming a source/drain region in the substrate, wherein the source/drain region is between the gate dielectric and the trench;

forming a conductive layer on the source/drain region wherein the trench is free from the conductive layer removing a portion of the dielectric to below a top surface of the substrate after the step of forming the conductive layer.

5. The method of claim 4, wherein the step of removing the portion of the dielectric comprises dry etch.

6. The method of claim 4, wherein after the step of removing the portion of the dielectric, the top surface of the dielectric is lower than a bottom surface of the conductive layer by a gap of between abut 50 Å and about 900 Å.

7. The method of claim 4 further comprising forming an etch stop layer over the gate electrode, the pair of gate spacers, the source/drain region and the dielectric, wherein the etch stop layer extends into a recess formed by the step of removing the portion of the dielectric.

8. The method of claim 4, wherein the step of forming the conductive layer comprises siliciding a top portion of the source/drain region.

9. The method of claim 4, wherein the dielectric comprises silicon oxide.

10. The method of claim 4 further comprising forming a trench liner in the trench before the step of filling the trench with the dielectric.

11. The method of claim 10, wherein the trench liner comprises silicon nitride.

12. The method of claim 10, wherein the trench liner has a thickness of between about 20 Å and about 200 Å.

13. The method of claim 10 further comprising forming an additional trench liner before the step of forming the trench liner, wherein the trench liner and the additional trench liner comprise different materials.

14. The method of claim 13, wherein the additional trench liner comprises thermal silicon oxide.

15. The method of claim 13, wherein the additional trench liner has a thickness of between about 20 Å and 500 Å.

16. The method of claim 4 further comprising forming a trench spacer on an exposed sidewall of the source/drain region, wherein the exposed sidewall is in the trench, and wherein the trench spacer is formed simultaneously with an entirety of the gate spacer.

17. The method of claim 16, wherein the trench spacer is formed using a method selected from the group consisting essentially of low-pressure chemical vapor deposition and plasma enhanced chemical vapor deposition.

* * * * *